United States Patent [19]

Salama et al.

[11] Patent Number: 4,588,960
[45] Date of Patent: May 13, 1986

[54] OUTPUT CIRCUITS OF CLASS B TYPE ELECTRONIC AMPLIFIERS

[75] Inventors: Clement A. Salama; Satwinder D. Malhi, both of Toronto, Calif.

[73] Assignee: University of Toronto Innovations Foundation, Ontario, Canada

[21] Appl. No.: 637,630

[22] Filed: Aug. 3, 1984

Related U.S. Application Data

[63] Continuation of Ser. No. 344,415, Feb. 1, 1982, abandoned.

[51] Int. Cl.[4] .............................................. H03F 3/30
[52] U.S. Cl. .................................. 330/264; 330/268; 330/300
[58] Field of Search ............... 330/264, 268, 269, 274, 330/300; 307/570

[56] References Cited

FOREIGN PATENT DOCUMENTS 660196 4/1979 U.S.S.R. ............................... 330/300

*Primary Examiner*—James B. Mullins
*Attorney, Agent, or Firm*—Hirons, Rogers & Scott

[57] ABSTRACT

The invention provides a class B output stage for an amplifier, more specifically an integrated circuit amplifier for low power, low voltage application, such as a hearing aid amplifier, that is of class B type with consequent negligible quiescent power dissipation, but which avoids the input voltage deadband of conventional class B stages that results in cross-over distortion. The stage uses a bipolar transistor and a field transistor connected in series. The field effect transistor has a gate-source pinch-off voltage that is approximately equal to the base-emitter voltage of the bipolar transistor, so that they are alternately "on" as the input voltage swings over its full value. In a preferred embodiment the bipolar transistor is an npn type while the field effect transistor is a bipolar compatible p-channel junction field effect transistor (JFET) with pinch-off voltage as close as possible but just less than the base emitter voltage of the bipolar transistor. The circuit is preferable realized in integrated circuit form.

7 Claims, 7 Drawing Figures

OUTPUT CIRCUITS OF CLASS B TYPE ELECTRONIC AMPLIFIERS

This is a continuation of application Ser. No. 344,415, filed Feb. 1, 1982, and now abandoned.

The present invention relates to output circuits of class B type amplifiers used in micropower applications and is particularly, but not exclusively, suited for use in integrated circuits.

In the design of linear electronic amplifier circuits an important consideration is the type of output stage that is to be employed. This consideration is particularly important in the case of integrated circuits because of the special problems involved. Thus, in an integrated circuit intended for audio amplification, such as a hearing aid amplifier, the output stage must deliver a specific output power with a relatively low level of signal distortion, and it should not cause any unnecessary limitation in the overall frequency response of the amplifier, such performance usually requires at least class AB operation. However, it is also a requirement to operate at small voltages and with the smallest possible quiescent power, since the power source is normally a small single-cell dry battery, and these requirements are most easily met by class B operation.

Class B operation usually will involve the circuit having a voltage transfer characteristic with a deadband in the input voltage centered about the origin, resulting in crossover distortion. With low voltage operation this deadband may extend over a substantial range of the input voltage resulting in distortion. The deadband can be eliminated by providing an output cirucit using class AB operation. This requires that the transistors are forward biased resulting in increased quiescent power dissipation, which is not attractive for micropower operation.

It is an object of the invention to provide an output stage of class B type for electronic amplifiers and in which the deadband voltage in the voltage transfer characteristic is minimised whilst also minimising quiescent power dissipation.

Broadly, the invention comprises an output stage having a bipolar transistor connected in series with a field effect transistor where the base-emitter voltage of the bipolar transistor is substantially the same as the gate-source voltage of the field effect transistor at the pinch-off value.

In accordance with one aspect of the present invention there is provided an output stage of class B type for an electronic circuit comprising:

In an output stage for use with an amplifier biased to operate in a class B mode, the output stage being connected between means to drive the output stage and a load, the improvement comprising a bipolar transistor operative to have a base-emitter voltage drop of a first value.

a field effect transistor operative to have a gate-source pinch-off voltage drop of a second value, the base of the bipolar transistor being coupled to the gate of the field effect transistor and the emitter of the bipolar transistor being coupled to the source of the field effect transistor, the value of the base-emitter voltage drop of the bipolar transistors and the value of the gate-source pinch-off voltage drop of the field effect transistor being selected to be substantially equal to minimise the deadband voltage in the voltage transfer characteristics of the output stage.

Preferably, the said gate-source voltage drop is just less than the said base-emitter voltage drop.

In the preferred embodiment, the bipolar transistor is an npn transistor, and the field effect transistor is a p-channel junction field effect transistor.

Embodiments of the invention will now be described, by way of example, with reference to the accompanying drawings in which:—

Figure 1:
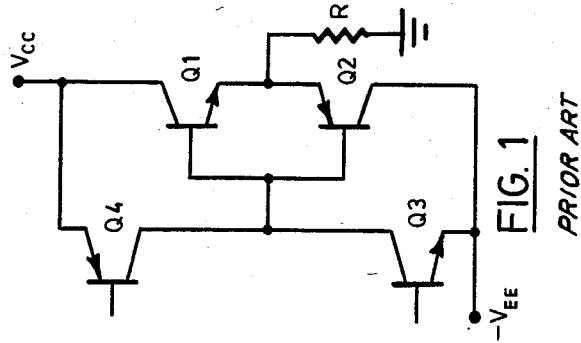
FIG. 1 shows a typical prior art integrated circuit amplifier output circuit having an output stage of class B type.
Figure 5C:
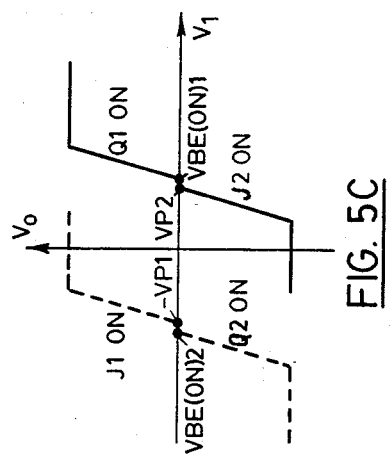
FIG. 5C is a graph of the voltage transfer characteristics of the circuits shown in FIG. 3 and FIG. 4; the transfer characteristics of FIG. 3 being shown in solid lines and the voltage transfer characteristics of FIG. 4 shown in broken lines.
Figure 5B:
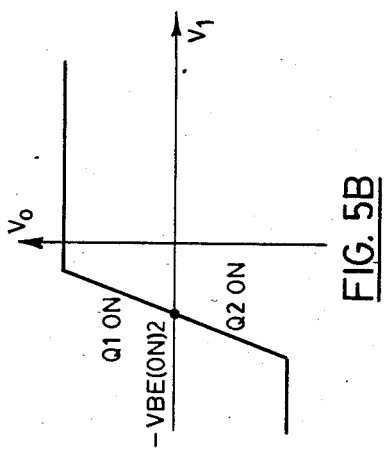
FIG. 5B is a graph of the voltage characteristics of the circuit of FIG. 2.
Figure 5A:
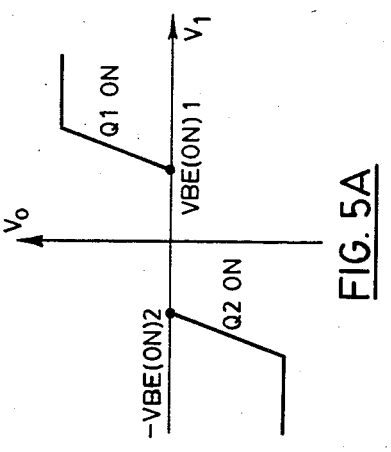
FIG. 5A is a graph of the voltage transfer characteristics of the circuits of FIG. 1.

Referring firstly to the prior art drawings, FIG. 1 shows an integrated circuit class B output stage in which an npn transistor Q1 has a common load RL with a pnp transistor Q2, the two transistors being driven respectively by pnp transistor Q3 and npn transistor Q4, the resulting output circuit receiving positive supply voltage VCC and negative supply voltage —VEE. The voltage transfer characteristics of the circuit is shown in FIG. 5A. For no load conditions there is substantially no power dissipation by output transistors Q1 and Q2 but a large deadband of value 2VBE(ON) is centered around the origin, giving rise to crossover distortion as described above which for low voltage is very substantial. VBE(ON) is the base-emitter voltage, typically 0.6–0.7 volts required to turn the respective transistor on, i.e. provide an output voltage. In the case of an npn transistor this is the base-emitter voltage; for a pnp transistor it will be the emitter-base voltage.

Figure 2:
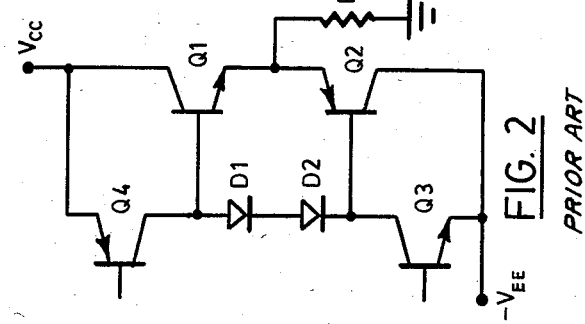
FIG. 2 shows a typical prior art integrated circuit amplifier output circuit having an output stage of class AB type.

The high distortion due to the deadband of the circuit of FIG. 1 is solved in the prior art class AB output circuit of FIG. 2. In this circuit transistors Q1 and Q2 are forward-biased in the quiescent state by respective diodes D1 and D2, thereby eliminating the deadband of the circuit of FIG. 1 as can be seen from the voltage transfer characteristic of FIG. 5B which extends continuously without a deadband at the origin, crossing the origin at —VBE(ON)2; in a "mirror-image" circuit the characteristic would cross the origin at VBE(ON)1 with the corresponding amount of power dissipation. However in the circuit of FIG. 2 quiescent power dissipation is increased due to the forward bias.

Figure 3:
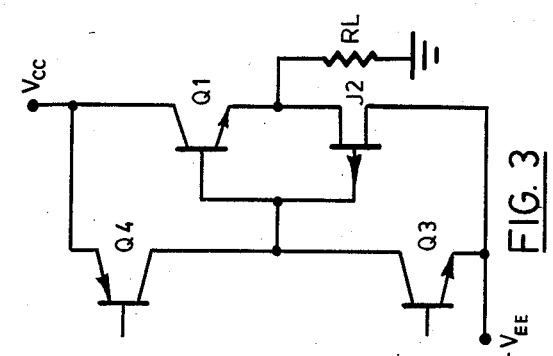
FIG. 3 shows an integrated circuit amplifier output circuits with a class B type output stages according to a preferred embodiment of the invention.

Referring now to FIG. 3, the output circuits shown are biased to operate as a class B type. The circuit of FIG. 3 uses an npn bipolar transistor Q1 having a base-emitter voltage drop when on of VBE(ON) in series with a bipolar compatible p-channel junction field effect transistor (JFET)J2 of a gate-source voltage such a value that it is usually referred to as the pinch-off voltage, VP, which is of approximately the same value as the base-emitter voltage of transistor Q1. The value of VP2 should be as close less or equal than the value VBE(ON).

i.e. VP2 VBE(ON)1

Ideally, it should be just less than the value VBE(ON).

In practice where the input voltage is about 0.6 to 0.7 volts a difference between VBE(ON) and VP2 of about 0.05–0.1 volt is required, of course, by manufacturing tolerances. The voltage transfer characteristic for the circuit of FIG. 3 is shown in solid lines in FIG. 5C. For positive output swing bipolar transistor Q1 is on and JFET J2 is off, while for negative output swing bipolar Q1 is off and JFET J2 is on. The respective voltages of VBE(ON) and VP(2) where the voltage transfer characteristic cross the output voltage zero value are so close together that the deadband has been minimised to a value which results in negligible crossover distortion. Moreover, under no-load conditions neither transistor Q1 or J2 is on, so that there is no quiescent power dissipation in the output stage (except due to unavoidable current leakages).

The positive signal swing for the class B amplifiers of both FIG. 1 and FIG. 3 is given by $$V_{st} = VCC - VBE1 - V(sat)4 \quad (1)$$

where VBE1 is the base emitter voltage of transistor Q1 and V(sat)4 is the collector saturation voltage of Q4.

The negative signal swing for the amplifier of FIG. 1 is given by $$VS-= -VEE + VEB2 + V(sat)3 \quad (2)$$

where VEB2 is the emitter-base voltage of transistor Q2 and V(sat)3 is the collector saturation voltage of transistor Q3.

The negative signal swing of the amplifier of FIG. 3 is given by $$1 = -VEE + VSD(sat)2 \quad (3)$$

where VSD(sat)2 is the source to drain saturation voltage of transistor J2. The values V(sat)3 of equation (2) and VSD(sat)2 of equation (3) are comparable in magnitude therefore the absence of any positive term such as VEB2 in the equation (3) implies that a much larger negative output voltage swing will be obtained for a given supply voltage.

Figure 4:
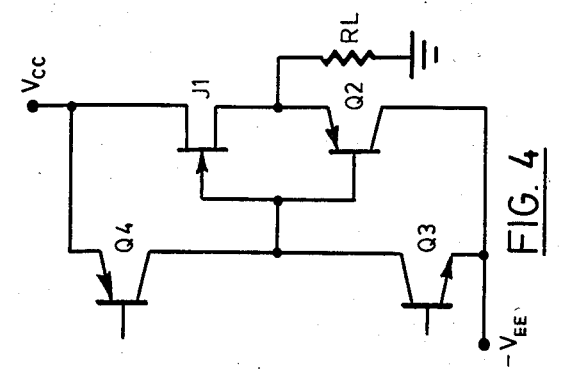
FIG. 4 is an integrated circuit amplifier output circuit with a class B type output stage according to an alternative embodiment of the invention.

FIG. 4 shows an alternative embodiment to FIG. 3 in which an n-channel JFET J1 and a pnp bipolar transmitter Q2 are connected in series. The voltage transfer characteristic of this circuit is also shown in FIG. 5C in broken lines. From FIG. 5C it can be seen that the pinch-off voltage VP1 of the transistor J1 is just less than the emitter-base voltage VEB(ON)2 of the transistor Q2 also resulting in negligible crossover distinction and minimised quiescent power dissipation.

This feature together with the absence of crossover distinction and minimised quiescent power dissipation under no load making the circuit of FIG. 3 and FIG. 4 very attractive for low voltage micropower applications.

The output stages and output circuits of the embodiments are particularly applicable to integrated circuits which are of inherently low power and preferably are operated at low voltages. Transistors Q1 and J2 (or J1 and Q2) are compatible with each other and can therefore be formed simultaneously on the same silicon substrate using integrated circuit manufacturing technology. However the circuit of FIG. 4 uses a pnp bipolar transistor which requires a more complex manufacturing process using integrated circuit technology. For this reason the circuit of FIG. 3 with the npn transistor, which is simpler to manufacture, is the preferred embodiment.

A method for the production of bipolar compatible JFET transistors is described and claimed in our application Ser. No. 304,998 filed Sept. 23, 1981, and now U.S. Pat. No. 4,549,193, the disclosure of which is incorporated herein by reference.

It should also be understood that the junction field effect transistors (JFET's) described herein may be readily replaced by insulated-gate field effect transistors (IGFET's) of the appropriate channel with the gate-source voltage of the IGFET selected to be just less than the base-emitter voltage of the bipolar transistor.

We claim:

1. In an output stage for use with an amplifier biased to operate in a class B mode, the output stage being connected between means to drive the output stage and a load, the improvement comprising
a bipolar transistor operative to have a base-emitter voltage drop of a first value,
a field effect transistor operative to have a gate-source pinch-off voltage drop of a second value, the base of the bipolar transistor being coupled to the gate of the field effect transistor and the emitter of the bipolar transistor being coupled to the source of the field effect transistor, the value of the base-emitter voltage drop of the bipolar transistor and the value of the gate-source pinch-off voltage drop of the field effect transistor being selected to be substantially equal to minimise the deadband voltage in the voltage transfer characteristics of the output stage.

2. An output stage as claimed in claim 1 wherein the bipolar transistor is an npn transistor and the field effect transistor is a p-channel junction field effect transistor.

3. An output stage as claimed in claim 2 wherein the magnitude of the gate-source pinch-off voltage drop is selected to be just less than the magnitude of the base-emitter voltage drop.

4. An output stage as claimed in claim 1 wherein the bipolar transistor is a pnp transistor and the field effect transistor is an n-channel junction field effect transistor.

5. An output stage as claimed in claim 4 wherein the magnitude of the gate-source pinch-off voltage drop is just less than the magnitude of the base-emitter voltage drop.

6. An output stage as claimed in claim 1 which is part of an amplifier implemented in an integrated circuit.

7. An output amplifier adapted to be biased to operate in a class B mode, the amplifier comprising
an output stage having an input and an output, means coupled to the input of output stage for feeding a signal to the output stage, load means connected to the output stage, the output stage having a bipolar transistor having a base-emitter voltage drop of a first value and a field effect transistor having a gate-source pinch-off voltage drop of a second value, the base of the bipolar transistor being coupled to the gate of the field effect transistor and the emitter of the bipolar transistor being coupled to the source of the field effect transistor, the value of the base-emitter voltage drop of the bipolar transistors and the value of the gate-source pinch-off voltage drop of the field effect transistor being selected to be substantially equal to minimise the deadband voltage in the voltage transfer characteristics of the output stage.

* * * * *